United States Patent
Xu et al.

(10) Patent No.: US 11,800,642 B2
(45) Date of Patent: Oct. 24, 2023

(54) BONDING PAD STRUCTURE FOR ELECTRONIC DEVICE AND MANUFACTURING METHOD THEREOF

(71) Applicant: TPK Advanced Solutions Inc., Fujian (CN)

(72) Inventors: Xian-Bin Xu, Xiamen (CN); He Luo, Longchang (CN); Ming-Qiang Fu, Liancheng County (CN); Xiong-Min Zhang, Zhangpu County (CN); Chen-Hsin Chang, Taoyuan (TW)

(73) Assignee: TPK Advanced Solutions Inc., Fujian (CN)

( * ) Notice: Subject to any disclaimer, the term of this patent is extended or adjusted under 35 U.S.C. 154(b) by 274 days.

(21) Appl. No.: 17/108,925

(22) Filed: Dec. 1, 2020

(65) Prior Publication Data

US 2022/0174818 A1   Jun. 2, 2022

(51) Int. Cl.
   *H05K 1/11*   (2006.01)
   *H05K 3/36*   (2006.01)

(52) U.S. Cl.
   CPC .............. *H05K 1/118* (2013.01); *H05K 1/111* (2013.01); *H05K 3/361* (2013.01); *H05K 2201/09418* (2013.01)

(58) Field of Classification Search
   CPC ........ H05K 1/118; H05K 1/111; H05K 3/361; H05K 2201/09918; H05K 2201/09418; H05K 2201/094; H01L 27/1244; H01L 23/5386; H01L 23/5387; H01L 27/1218; H01L 23/488; H01L 24/02; H01L 24/07; H01L 24/09; H01L 27/12; H01L 27/32; H01L 2224/02; H01L 2224/09; H01L 2224/0905; H01L 2224/0912; G02F 1/13452; G02F 1/1362; G06F 3/0412; G06F 2203/04102

See application file for complete search history.

(56) References Cited

U.S. PATENT DOCUMENTS

| | | | | |
|---|---|---|---|---|
| 5,951,304 | A | * 9/1999 | Wildes | H05K 3/361 257/E23.07 |
| 2018/0090442 | A1 | * 3/2018 | Li | H01L 23/4985 |
| 2018/0108682 | A1 | * 4/2018 | Li | G02F 1/13452 |
| 2019/0139481 | A1 | * 5/2019 | Zhang | G09G 3/2096 |
| 2019/0198473 | A1 | * 6/2019 | Li | H01L 24/13 |
| 2019/0357367 | A1 | * 11/2019 | Chung | H05K 1/111 |

FOREIGN PATENT DOCUMENTS

| | | |
|---|---|---|
| CN | 201571253 U | 9/2010 |
| TW | 201830360 A | 8/2018 |
| TW | M607729 U | 2/2021 |

* cited by examiner

*Primary Examiner* — Steven T Sawyer
(74) *Attorney, Agent, or Firm* — Cooper Legal Group, LLC

(57) ABSTRACT

A bonding pad structure includes a substrate, a flexible printed circuit board, and a plurality of bonding pins. The bonding pins include at least one central bonding pin and at least two first bonding pins. The at least one central bonding pin is located at a center of bonding pins. The at least two first bonding pins are located farthest away from the at least one central bonding pin and have mirror symmetry with respect to the at least one central bonding pin. The at least one central bonding pin includes a first end and a second end. A first width A of the first end and a second width B of the second end satisfy $0<A/B\leq 1$.

A tilt angle $\theta$ is formed between one of the at least two first bonding pins and one side of the substrate and satisfies $0<\theta\leq 90$.

10 Claims, 8 Drawing Sheets

BONDING PAD STRUCTURE FOR ELECTRONIC DEVICE AND MANUFACTURING METHOD THEREOF

BACKGROUND

Field of Disclosure

The present disclosure relates to an electronic device and a method. More particularly, the present disclosure relates to a bonding pad structure for an electronic device and a method for manufacturing the bonding pad structure for an electronic device.

Description of Related Art

Conventional display panels are developing towards technology of ultra-thin flexible substrate. For increasing screen-to-body ratios of display panels, bonding areas surrounding display panels are compressed.

In addition, during a bonding process, bonding pads of display panels cannot be aligned with each other due to thermal expansion of materials of bonding pads. Based on CN201571253U, two conventional circuit substrates, which overlap each other, need to face a problem of increasing common difference of a product during a bonding alignment. Anti-swelling of hard plate materials is often used to reduce bonding misalignment of bonding pad structures. However, when products are forced to face a next generation of ultra-thin flexible substrate technology, problems of thermal expansion of the bonding thin film substrate become more serious, and a conventional bonding method cannot suppress bonding misalignment effectively.

For the foregoing reason, there is a need to provide some other suitable pin design method to solve the problems of bonding misalignment.

SUMMARY

One aspect of the present disclosure provides a bonding pad structure for an electronic device. The bonding pad structure for the electronic device includes a substrate and a flexible printed circuit board. The substrate includes a plurality of first pins. The plurality of first pins are disposed on the substrate. The flexible printed circuit board includes a plurality of second pins. The plurality of second pins are disposed on the flexible printed circuit board. The plurality of first pins and the plurality of second pins are bonded to each other to define a plurality of bonding pins. The plurality of bonding pins include at least one central bonding pin and at least two first bonding pins. The at least one central bonding pin is located in a central location of the plurality of bonding pins. The at least two first bonding pins are located farthest away from the at least one central bonding pin, and the at least two first bonding pins have mirror symmetry with respect to the at least one central bonding pin. The at least one central bonding pin includes a first end and a second end. A first width of the first end is set to be A. A second width of the second end is set to be B. A and B satisfy a first relation $0 < A/B \leq 1$. A tilt angle is defined between one of the at least two first bonding pins and one side of the substrate. The tilt angle is set to be $\theta$, and $\theta$ satisfies a second relation $0 < \theta \leq 90$.

In the foregoing, the plurality of bonding pins further include at least two second bonding pins. The at least two second bonding pins are located between the at least one central bonding pin and the at least two first bonding pins and have mirror symmetry with respect to the at least one central bonding pin. One of the at least two second bonding pins includes a third end and a fourth end. A third width of the third end is set to be C, a fourth width of the fourth end is set to be D, and C and D satisfy a third relation $0 < C/D \leq 1$.

In the foregoing, the first width of the first end of the at least one central bonding pin is the same as the third width of the third end of the one of the at least two second bonding pins.

In the foregoing, the second width of the second end of the at least one central bonding pin is the same as the fourth width of the fourth end of the one of the at least two second bonding pins.

In the foregoing, a first spacing is defined between the first end of the at least one central bonding pin and the third end of the one of the at least two second bonding pins, and the first spacing, the first width of the first end, and the third width of the third end are all the same.

In the foregoing, a second spacing is defined between the second end of the at least one central bonding pin and the fourth end of the one of the at least two second bonding pins, the second spacing, the second width of the second end, and the fourth width of the fourth end are all the same, and the first spacing is smaller than the second spacing.

In the foregoing, the plurality of bonding pins are located in a bonding area of the electronic device. A fourth relation between the second spacing, the second width of the second end, the fourth width of the fourth end, and a length L of the bonding area is listed below:

$$B = D = F = L/(X+Y)$$

which B is the second width of the second end, D is the fourth width of the fourth end, F is the second spacing, L is the length of the bonding area, X is a number of the plurality of bonding pins, and Y is a number of internal spacings defined between every two of the plurality of bonding pins.

In the foregoing, the at least one central bonding pin is trapezoidal and the at least two first bonding pins are trapezoidal.

In the foregoing, the at least one central bonding pin, the at least two first bonding pins and the at least two second bonding pins are arranged on a same straight line.

In the foregoing, the plurality of bonding pins further include at least two third bonding pins. The at least two third bonding pins are located between the at least two first bonding pins and the at least two second bonding pins and have mirror symmetry with respect to the at least one central bonding pin. One of the at least two third bonding pins includes a fifth end and a sixth end. A fifth width of the fifth end is set to be G, a sixth width of the sixth end is set to be H, and G and H satisfy a fifth relation $0 < G/H \leq 1$.

In the foregoing, a third spacing is defined between the third end of the one of the at least two second bonding pins and the fifth end of the one of the at least two third bonding pins. A fourth spacing is defined between the fourth end of the one of the at least two second bonding pins and the sixth end of the one of the at least two third bonding pins. The third spacing is smaller the fourth spacing.

In the foregoing, the first spacing, the third spacing, the first width, the third width, and the fifth width are all the same, and the fourth spacing, the second width, the fourth width, and sixth width are all the same.

In the foregoing, the at least one central bonding pin, the at least two first bonding pins, the at least two second bonding pins, and the at least two third bonding pins are arranged on a same straight line.

In the foregoing, one of the first pins or the second pins has an expansion value during a pre-bonding procedure.

Another aspect of the present disclosure provides a method for manufacturing a bonding pad structure for an electronic device. The method for manufacturing the bonding pad structure for the electronic device includes the following steps: disposing a plurality of first pins on a substrate; disposing a plurality of second pins on a flexible printed circuit board; and bonding the first pins and the second pins to each other to form at least one central bonding pin in a central location of a bonding area of the electronic device, and form at least two first bonding pins located farthest away from the at least one central bonding pin. The at least two first bonding pins have mirror symmetry with respect to the at least one central bonding pin. The at least one central bonding pin include a first end and a second end. A first width of the first end is set to be A. A second width of the second end is set to be B. A and B satisfy a first relation $0<A/B\leq 1$. A tilt angle is formed between one of the at least two first bonding pins and one side of the substrate. The tilt angle is set to be $\theta$, and $\theta$ satisfies a second relation $0<\theta\leq 90$.

In the foregoing, bonding the first pins and the second pins includes: pre-bonding the first pins and the second pins, and the second pins generate an expansion value during a pre-bonding procedure.

In the foregoing, bonding the first pins and the second pins further includes: adjusting the first pins and the second pins to form the at least one central bonding pin and the at least two first bonding pins according to the expansion value.

In the foregoing, bonding the first pins and the second pins includes: bonding the first pins and the second pins to form the at least one central bonding pin in the central location of the bonding area of the electronic device, form the at least two first bonding pins located farthest away from the at least one central bonding pin and having mirror symmetry with respect to the at least one central bonding pin, and form at least two second bonding pins located between the at least one central bonding pin and the at least two first bonding pins and having mirror symmetry with respect to the at least one central bonding pin. One of the at least two second bonding pins includes a third end and a fourth end. The third width of the third end is set to be C, a fourth width of the fourth end is set to be D and C and D satisfy a third relation $0<C/D\leq 1$.

Another aspect of the present disclosure provides a bonding pad structure for an electronic device. The bonding pad structure for the electronic device includes a substrate and a flexible printed circuit board. The substrate includes a plurality of first pins. The plurality of first pins are disposed on the substrate. The flexible printed circuit board includes a plurality of second pins. The plurality of second pins are disposed on the flexible printed circuit board. The plurality of first pins and the plurality of second pins are bonded to each other to define a plurality of bonding pins. The plurality of bonding pins include at least one central bonding pin and at least two first bonding pins. The at least one central bonding pin is located in a central location of the plurality of bonding pins. The at least two first bonding pins are located farthest away from the at least one central bonding pin and have mirror symmetry with respect to the at least one central bonding pin. The at least one central bonding pin includes a first end and a second end. A first width of the first end is set to be A'. A second width of the second end is set to be B'. A' and B' satisfy a sixth relation $A'/B'\geq 1$. A tilt angle is formed between one of the at least two first bonding pins and one side of the substrate. The tilt angle is set to be $\varphi$, and $\varphi$ satisfies a seventh relation $0<\varphi\leq 90$.

In the foregoing, the plurality of bonding pins further include at least two second bonding pins. The at least two second bonding pins are located between the at least one central bonding pin and the at least two first bonding pins and have mirror symmetry with respect to the at least one central bonding pin. One of the at least two second bonding pins includes a third end and a fourth end. A third width of the third end is set to be C', a fourth width of the fourth end is set to be D', and C' and D' satisfy an eighth relation $C'/D'\geq 1$.

In the foregoing, the first width of the first end of the at least one central bonding pin is the same as the third width of the third end of the one of the at least two second bonding pins.

In the foregoing, the second width of the second end of the at least one central bonding pin is the same as the fourth width of the fourth end of the one of the at least two second bonding pins.

In the foregoing, a first spacing is defined between the first end of the at least one central bonding pin and the third end of the one of the at least two second bonding pins, and the first spacing, the first width of the first end, and the third width of the third end are all the same.

In summary, the present disclosure provides a bonding pad structure for an electronic device and a method for manufacturing a bonding pad structure for electronic device to improve (i.e., reduce) problems in which bonding pads of display panels cannot be aligned to each other due to thermal expansion of materials of bonding pads.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiments, with reference made to the accompanying drawings as follows.

DETAILED DESCRIPTION

Figure 1A:
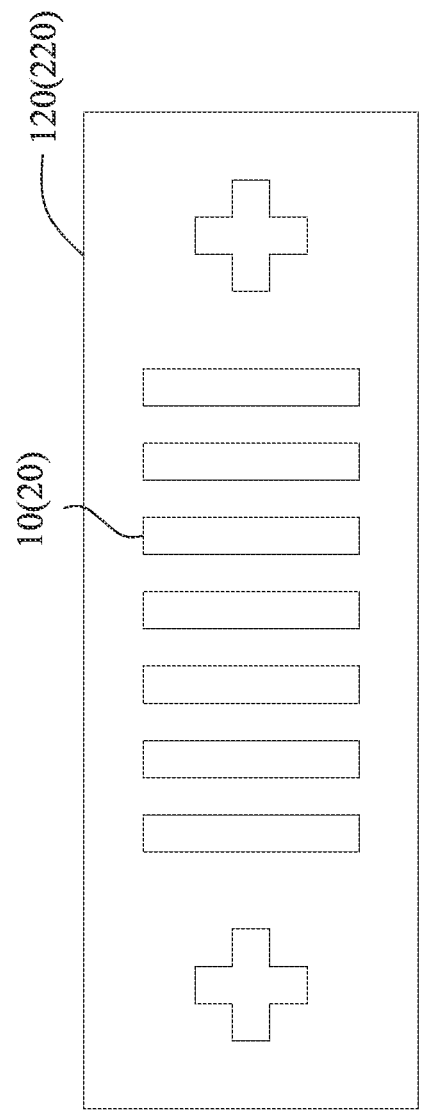
FIG. 1A depicts an expected pin diagram according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise.

Furthermore, it should be understood that the terms, "comprising", "including", "having", "containing", "involving" and the like, used herein are open-ended, that is, including but not limited to.

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

Figure 1B:
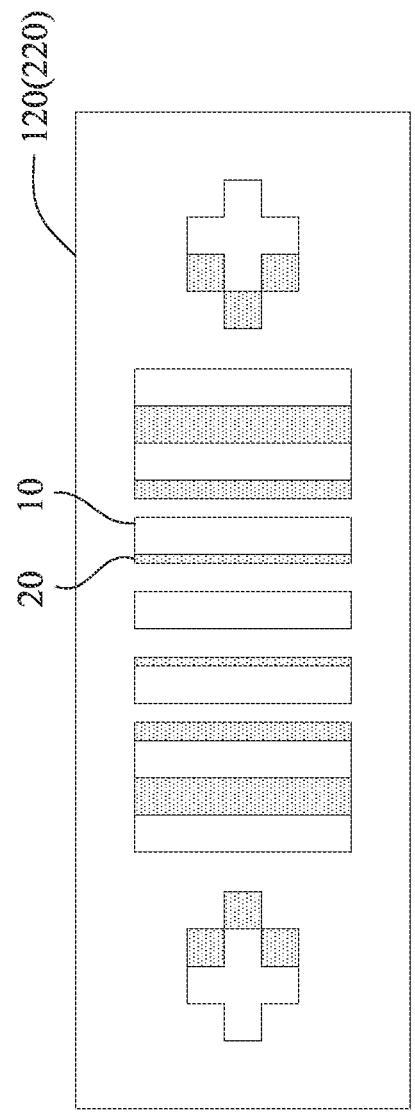
FIG. 1B depicts an actual pin diagram according to some embodiments of the present disclosure.

In some embodiments, in order to facilitate the understanding of a structure of an electronic device 100, please refer to FIG. 1A to FIG. 1B. FIG. 1A depicts an expected pin diagram according to some embodiments of the present disclosure. FIG. 1B depicts an actual pin diagram according to some embodiments of the present disclosure. Please refer to FIG. 1A to FIG. 1B, the electronic device 100 includes a substrate 120 and a flexible printed circuit board 220. In some embodiments, the electronic device 100 may be a panel or a display device.

In some embodiments, referring to FIG. 1A to FIG. 1B, the substrate 120 includes pins 10. The flexible printed circuit board 220 includes pins 20. In simulation, it is expected that the pins 10 and the pins 20 are bonded to form a completely overlapped structure as shown in FIG. 1A. In practice, the pins 10 and the pins 20 are bonded to form a misalignment structure as shown in FIG. 1B due to a thermal expansion of materials of the pins 10, 20.

Figure 2:
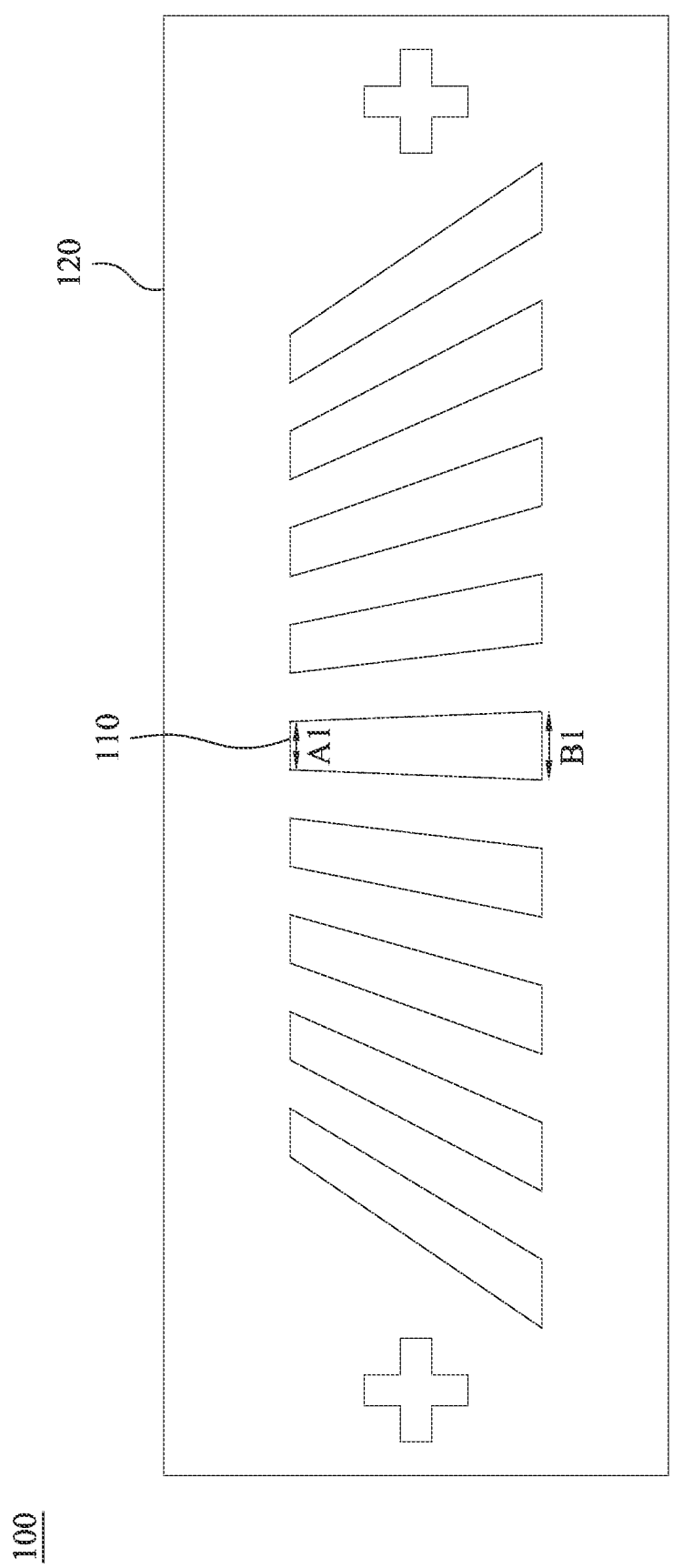
FIG. 2 depicts a pin diagram of a substrate according to some embodiments of the present disclosure.
Figure 3:
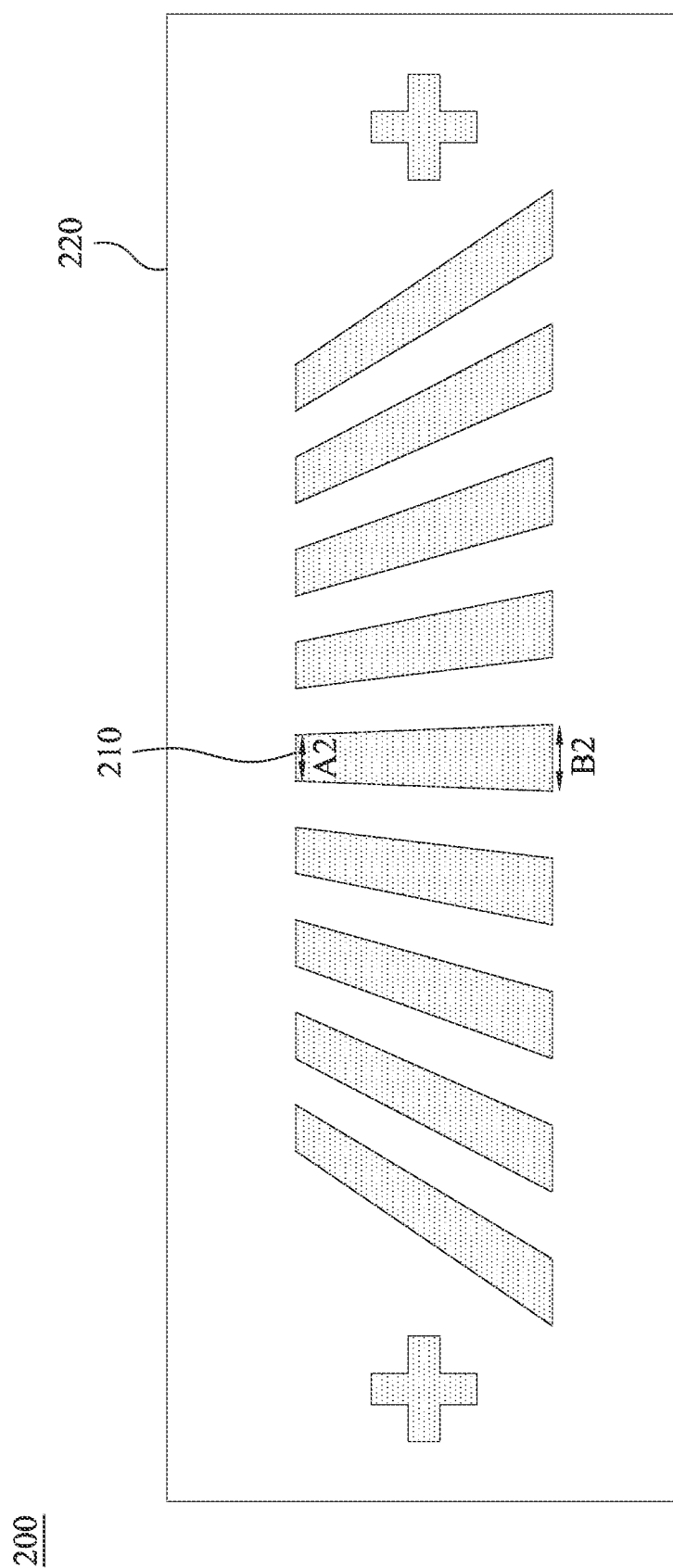
FIG. 3 depicts a pin diagram of a flexible printed circuit board according to some embodiments of the present disclosure.
Figure 4:
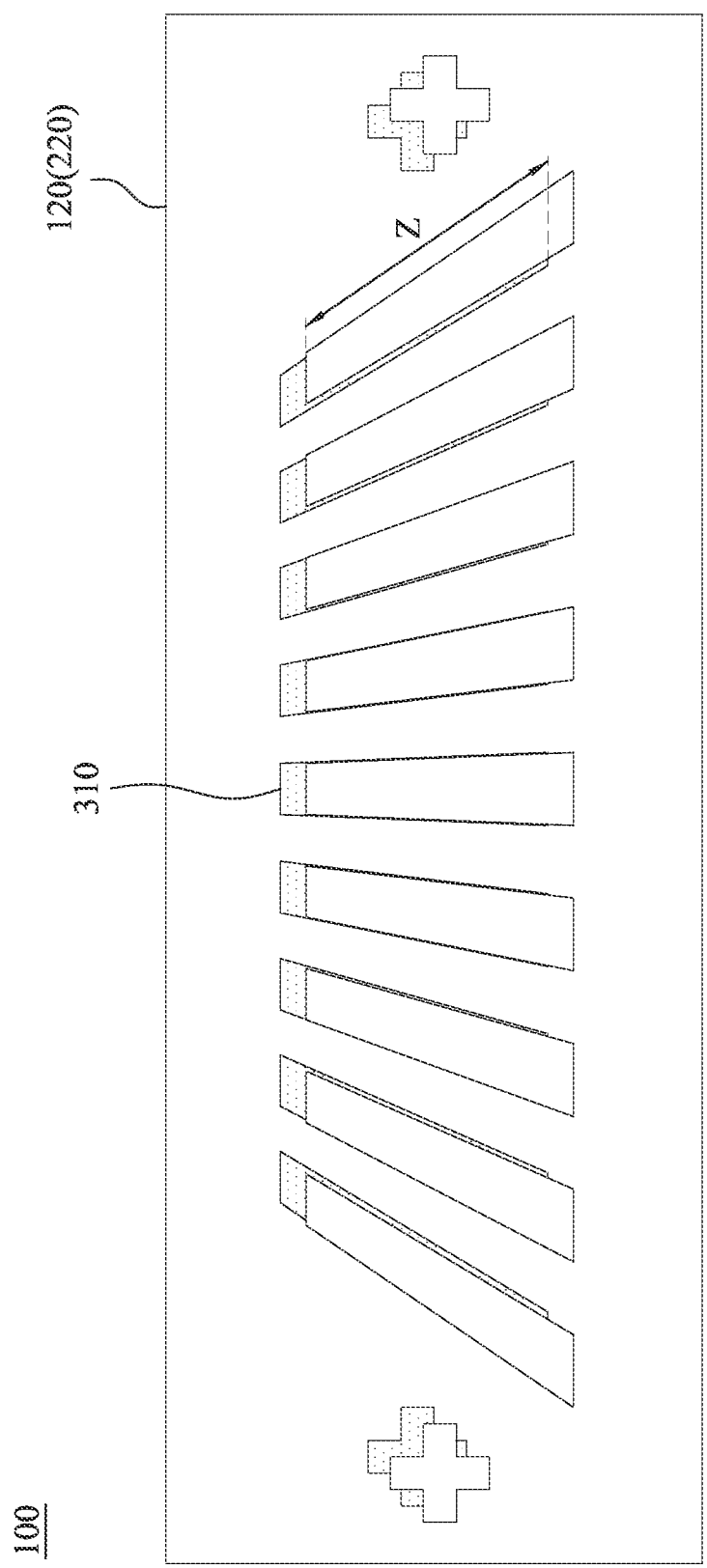
FIG. 4 depicts a bonding pin diagram according to some embodiments of the present disclosure.

In some embodiments, in order to facilitate an understanding of a bonding pad structure of the electronic device 100, please refer to FIG. 2 to FIG. 4. FIG. 2 depicts a pin diagram of a substrate 120 according to some embodiments of the present disclosure. FIG. 3 depicts a pin diagram of a flexible printed circuit board 220 according to some embodiments of the present disclosure. FIG. 4 depicts a bonding pin diagram according to some embodiments of the present disclosure.

In some embodiments, with reference to FIG. 2, a substrate pin diagram of the electronic device 100 is provided. The substrate 120 includes a plurality of first pins 110. The internal error of a width A1 of the top end of the first pins 110 shown in FIG. 2 is within ±50 μm. The internal error of a width B1 of the bottom end of the first pins 110 shown in FIG. 2 is within ±50 μm.

In some embodiments, with reference to FIG. 3, a flexible printed circuit board pin diagram of the electronic device 100 is provided. The flexible printed circuit board 220 includes a plurality of second pins 210. The internal error of a width A2 of the top end of the second pins 210 shown in FIG. 3 is within ±50 μm. The internal error of a width B2 of the bottom end of the second pins 210 shown in FIG. 3 is within ±50 μm.

In some embodiments, referring to FIG. 2 to FIG. 4, the plurality of first pins 110 and the plurality of second pins 210 are bonded to each other to form a plurality of bonding pins 310. In some embodiments, Z is a width of a bonding area where the plurality of first pins 110 and the plurality of second pins 210 are actually bonded.

Figure 5:
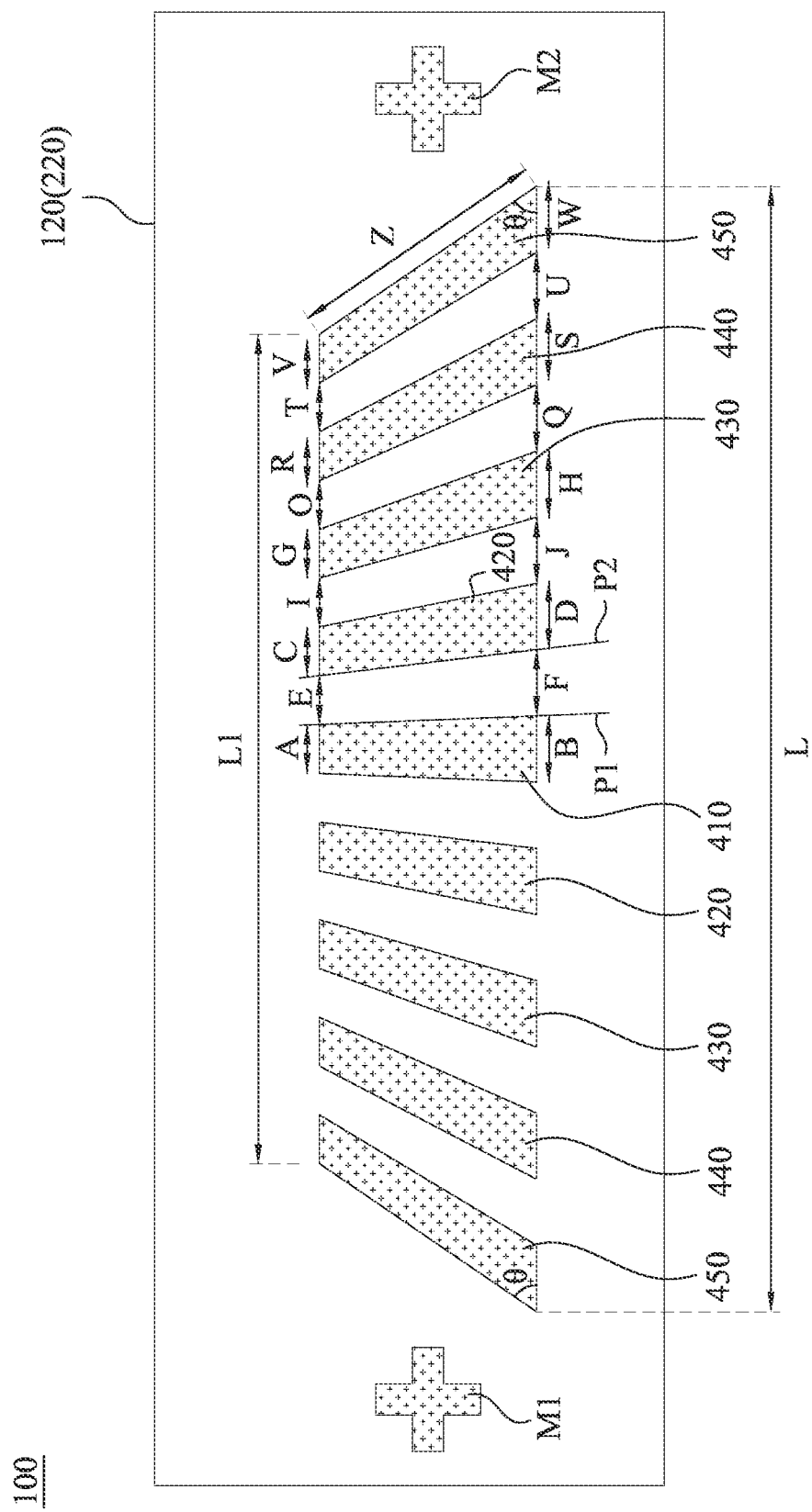
FIG. 5 depicts a bonding pin diagram according to some embodiments of the present disclosure.

FIG. 5 depicts a bonding pin diagram according to some embodiments of the present disclosure. In some embodiments, the plurality of bonding pins 310 shown in FIG. 4 are bonded to form the bonding pins 410, 420, and 430 shown in FIG. 5. The electronic device 100 includes a first side M1 and a second side M2. It is noted that although the first side M1 and the second side M2 are depicted as a left side and a right side in FIG. 5 respectively, the first side M1 and the second side M2 are not limited to the left side and the right side.

In addition, the plurality of bonding pins include at least one central bonding pin 410 and at least two first bonding pins 450. The at least one central bonding pin 410 is located in a central location of the plurality of bonding pins. The at least two first bonding pins 450 are located farthest away from the at least one central bonding pin 410 and have mirror symmetry with respect to the least one central bonding pin 410. The first bonding pins 450 are located closest to the first side M1 and the second side M2, a tilt angle is formed between one of the first bonding pins 450 and one side of the substrate 120 (e.g., the bottom side shown in FIG. 5), and the tilt angle is set to be θ. When the bonding pins become closer to a central location, the tilt angle θ becomes closer to 90°.

In addition, the first width of the first end is set to be A. The second width of the second end is set to be B. A and B satisfy a relation 0<A/B≤1. The tilt angle θ is formed between one of the at least two first bonding pins 450 and one side of the substrate 120 (e.g., the bottom side shown in FIG. 5), and θ satisfies a relation 0<θ≤90.

In some embodiments, the plurality of bonding pins further include at least two second bonding pins 420. The at least two second bonding pins 420 are located between the at least one central bonding pin 410 and at least two first bonding pins 450 and have mirror symmetry with respect to the least one central bonding pin 410. The at least two second bonding pins 420 include a third end and a fourth end. The third width of the third end is set to be C. The fourth width of the fourth end is set be D. C and D satisfy a relation 0<C/D≤1.

In addition, the at least one central bonding pin 410 includes a first end (e.g., the top end shown in FIG. 5) and a second end (e.g., the bottom end shown in FIG. 5). In some embodiments, the at least one central bonding pin 410 can be trapezoidal.

In addition, one of the at least two second bonding pins 420 (e.g. the second bonding pin 420 which is close to the right side shown in FIG. 5) includes a third end (e.g., the top end shown in FIG. 5) and a fourth end (e.g., the bottom end shown in FIG. 5). In some embodiments, each of the second bonding pins 420 in FIG. 5 can be trapezoidal.

Furthermore, the at least two first bonding pins 450 which are closest to the first side M1 and the second side M2 are both trapezoidal.

In some embodiments, referring to FIG. 5, the first width A of the first end of the at least one central bonding pin 410 and the third width C of the third end of one of the at least two second bonding pins 420 are the same.

In some embodiments, the second width B of the second end of the at least one central bonding pin 410 and the fourth width D of the fourth end of the at least two second bonding pins 420 are the same.

In some embodiments, a first spacing E is formed between the first end of the at least one central bonding pin 410 and the third end of one of the at least two second bonding pins 420 (e.g. the second bonding pin 420 which is close to the right side shown in FIG. 5). The first spacing E, the first width A of the first end, and the third width C of the third end are all the same.

In some embodiments, a second spacing F is formed between the second end of the at least one central bonding pin 410 and the fourth end of one of the at least two second bonding pins 420 (e.g. the second bonding pin 420 which is close to the right side shown in FIG. 5). The second spacing F, the second width B of the second end, and the fourth width D of the fourth end are all the same. The first spacing E is smaller than the second spacing F. It is noted that a boundary line P1 of the at least one central bonding pin 410 and a boundary line P2 of the at least two second bonding pins 420 (e.g. the second bonding pin 420 which is close to the right side shown in FIG. 5) are not parallel, and a spacing is gradually tightened from the second spacing F to the first spacing E along the boundary line P1 and the boundary line P2.

In some embodiments, the plurality of bonding pins are located in the bonding area of the electronic device 100. A relation between the second spacing F, the second width B of the second end, the fourth width D of the fourth end, and a length L of the bonding area is listed below:

$$B=D=F=L/(X+Y) \qquad \text{formula 1}$$

In formula 1, X is a number of the plurality of bonding pins, and Y is a number of internal spacings formed between every two of the bonding pins. For example, the internal spacing can be the spacing F between the bonding pin 410 and the bonding pin 420 shown in FIG. 4.

Then, a relation between the first spacing E, the first width A of the first end, the third width C of the third end, and a designed length L1 of the bonding area is listed below:

$$A=C=E=L1/(X+Y) \qquad \text{formula 2}$$

In formula 2, L1 is the designed length of the bonding area that makes the bonding pins have the shape of a Chinese character '八', and a relation between the length L of the bonding area and the designed length L1 of the bonding area satisfies $0<L1/L\le1$.

In some embodiments, referring to FIG. 5, the at least one central bonding pin 410 is an isosceles trapezoid. It is noted that when the number of the bonding pins on both sides of the at least one central pin 410 increases, the patterns of the bonding pins on both sides tend to parallelogram.

In some embodiments, the at least one central bonding pin 410, the at least two second bonding pins 420, and the at least two first bonding pins 450 are arranged on a same straight line.

In some embodiments, the plurality of bonding pins further include at least two third bonding pins 430. The at least two third bonding pins 430 are located between the at least two second bonding pins 420 and the at least two first bonding pins 450 and have mirror symmetry with respect to the at least one central bonding pin 410. One of the at least two third bonding pins 430 (e.g. the third bonding pins 430 which is close to the right side shown in FIG. 5) includes a fifth end (e.g., the top end shown in FIG. 5) and a sixth end (e.g., the bottom end shown in FIG. 5). A fifth width of the fifth end is set to be G. A sixth width of the sixth end is set to be H. G and H satisfy a relation $0<G/H\le1$.

In some embodiments, referring to FIG. 5, a third spacing I is formed between the first end of one of the at least two second bonding pins 420 (e.g., the second bonding pin 420 which is close to the right side shown in FIG. 5) and the third end of one of the at least two third bonding pins 430 (e.g., the third bonding pin 430 which is close to the right side shown in FIG. 5).

In addition, a fourth spacing J is formed between the second end of the at least two second bonding pins 420 and the fourth end of the at least two third bonding pins 430. The third spacing I is smaller than the fourth spacing J. It is noted that the at least two second bonding pins 420 can be trapezoidal, and the at least two third bonding pins 430 can also be trapezoidal.

In some embodiments, the first spacing E, the third spacing I, the first width A of the first end, the third width C of the third end, and the fifth width G of the fifth end are all the same. The second spacing F, the fourth spacing J, the second width B of the second end, the fourth width D of the fourth end, and a sixth width H of the sixth end are all the same.

In some embodiments, the at least one central bonding pin 410, the at least two second bonding pins 420, the least two third bonding pins 430, and the at least two first bonding pins 450 are arranged on a same straight line.

In some embodiments, referring to FIG. 5, based on the above embodiments, an upper spacing O is formed between the third bonding pins 430 and the fourth bonding pins 440. An upper spacing T is formed between the fourth bonding pins 440 and the first bonding pins 450. The fourth bonding pins 440 include a top width R and a bottom width S.

In some embodiments, a lower spacing Q is formed between the third bonding pins 430 and the fourth bonding pins 440. A lower spacing U is formed between the fourth bonding pins 440 and the first bonding pins 450. The first bonding pins 450 include a top width V and a bottom width W.

In some embodiments, the first spacing E, the third spacing I, the first width A of the first end, the third width C of the third end, the fifth width G of the fifth end, the top width R, the top width V, the upper spacing O, and the upper spacing T are all the same.

In addition, the second spacing F, the fourth spacing J, the second width B of the second end, the fourth width D of the fourth end, the sixth width H of the sixth end, the bottom width S, the bottom width W, the lower spacing Q, and the lower spacing U are all the same.

Figure 6A:
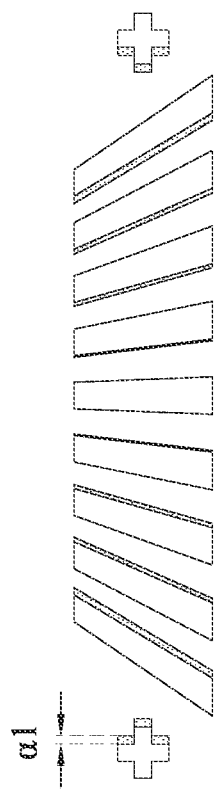
FIG. 6A depicts a bonding pin diagram of pre-bonding and expansion according to some embodiments of the present disclosure.
Figure 6B:
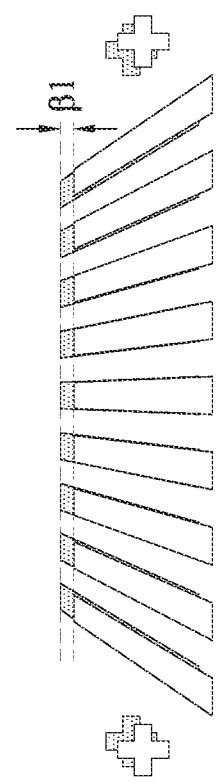
FIG. 6B depicts a bonding pin diagram of adjusting and bonding according to some embodiments of the present disclosure.
Figure 6C:
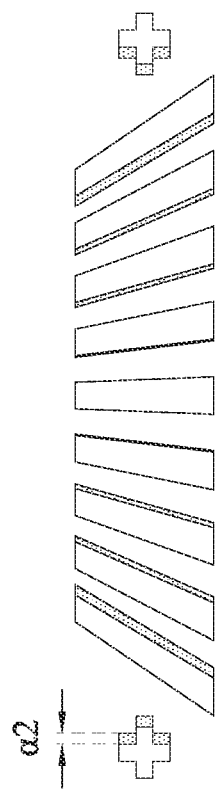
FIG. 6C depicts a bonding pin diagram of pre-bonding and expansion according to some embodiments of the present disclosure.
Figure 6D:
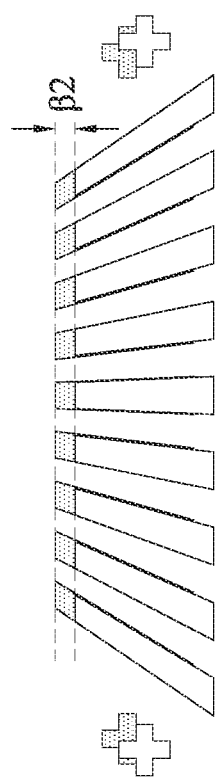
FIG. 6D depicts a bonding pin diagram of adjusting and bonding according to some embodiments of the present disclosure.
Figure 6E:
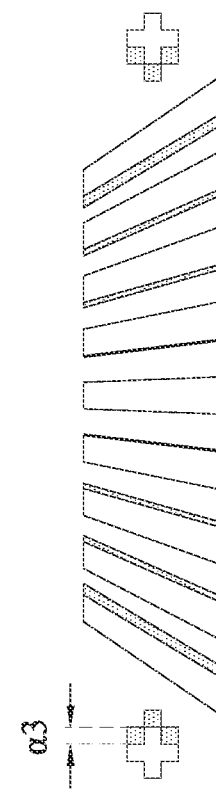
FIG. 6E depicts a bonding pin diagram of pre-bonding and expansion according to some embodiments of the present disclosure.
Figure 6F:
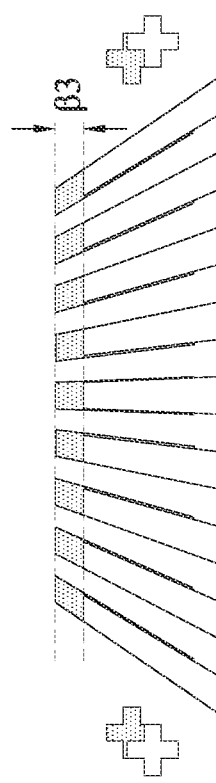
FIG. 6F depicts a bonding pin diagram of adjusting and bonding according to some embodiments of the present disclosure.
Figure 7:
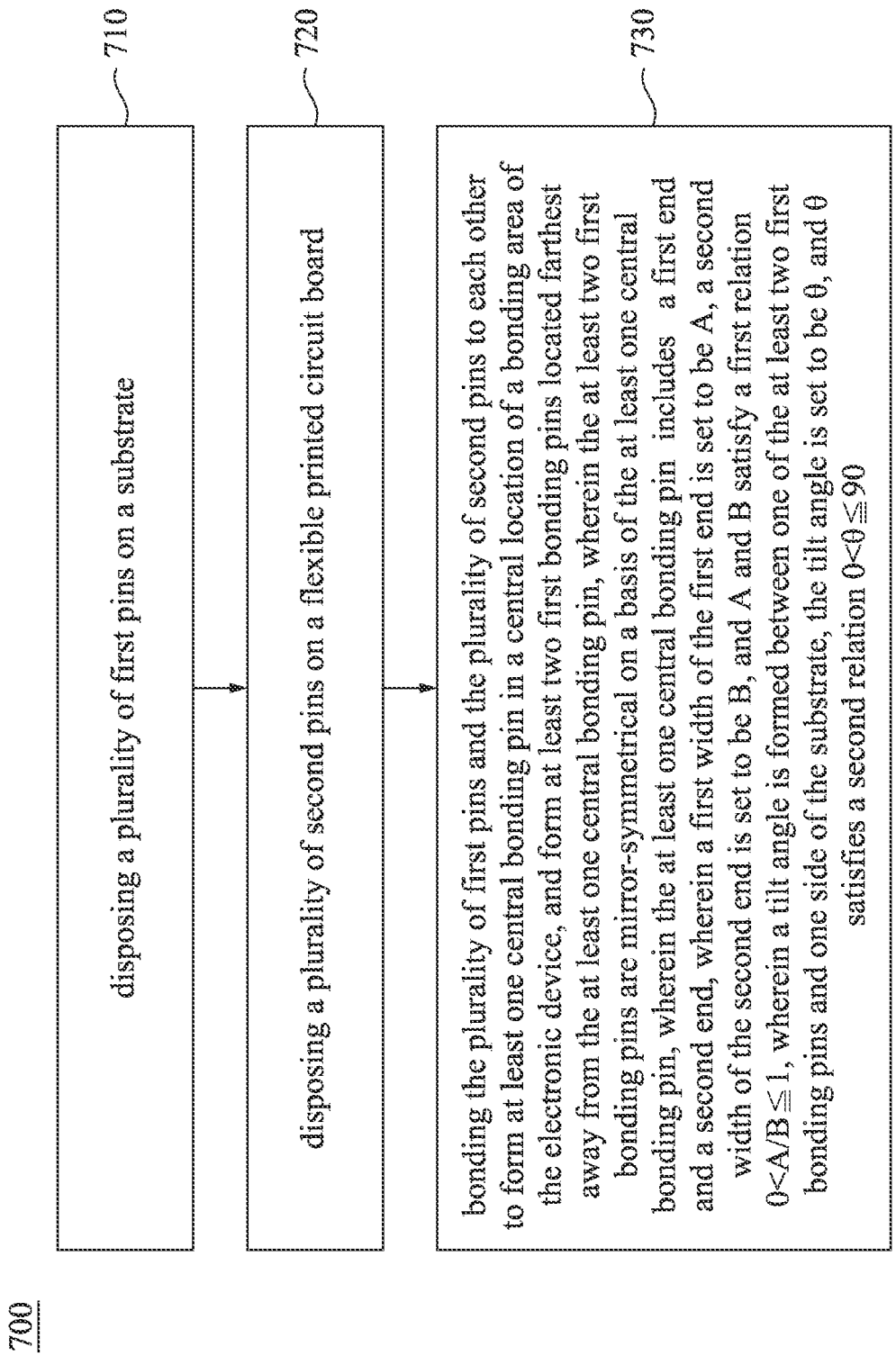
FIG. 7 depicts a flowchart of steps of a method for manufacturing a bonding pad structure for an electronic device according to some embodiments of the present disclosure.

In some embodiments, in order to facilitate the understanding of the difference of adjusting bonding pins due to the expansion value of the bonding pins, please refer to FIG. 6A to FIG. 6F and FIG. 7. FIG. 6A to FIG. 6F depict a bonding pin diagram of pre-bonding and expansion and adjusting and bonding according to some embodiments of the present disclosure. FIG. 7 depicts a flowchart of steps of a method for manufacturing a bonding pad structure for an electronic device according to some embodiments of the present disclosure. In some embodiments, the method 700 for manufacturing the bonding pad structure for the electronic device is configured to bond the substrate 120 shown in FIG. 2 and the flexible printed circuit board 220 shown in FIG. 3 to each other to form the plurality of the bonding pins 310 shown in FIG. 4.

In step 710, a plurality of first pins are disposed on a substrate.

For example, referring to FIG. 2, the plurality of first pins 110 are disposed on the substrate 120.

In step 720, a plurality of second pins are disposed on a flexible printed circuit board.

For example, referring to FIG. 3, the plurality of second pins 210 are disposed on the flexible printed circuit board 220.

In step 730, the plurality of first pins and the plurality of second pins are bonded to each other to form at least one central bonding pin in a central location of a bonding area of the electronic device and form at least two first bonding pins located farthest away from the at least one central bonding pin, wherein the at least two first bonding pins have mirror symmetry with respect to the at least one central bonding pin, wherein the at least one central bonding pin includes a first end and a second end, wherein a first width of the first end is set to be A, a second width of the second end is set to be B, and A and B satisfy a relation 0<A/B≤1, wherein a tilt angle is formed between one of the at least two first bonding pins and one side of the substrate, the tilt angle is set to be θ, and θ satisfies a second relation 0<θ≤90.

For example, referring to FIG. 2 to FIG. 7, the plurality of the first pins 110 and the plurality of the second pins 210 are bonded to form the at least one central bonding pin 410 in the central location of the bonding area of the electronic device 100 and form the at least two first bonding pins 450 located farthest away from the at least one central bonding pin 410 and having mirror symmetry with respect to the at least one central bonding pin 410. The at least one central bonding pin 410 includes a first end (e.g., the top end shown in FIG. 5) and a second end (e.g., the bottom end shown in FIG. 5). The first width of the first end is set to be A. The second width of the second end is set to be B. A and B satisfy a relation 0<A/B≤1. A tilt angle θ is formed between one of the at least two first bonding pins 450 and one side of the substrate 120 (e.g., the bottom side shown in FIG. 5), and θ satisfies a relation 0<θ≤90.

In some embodiments, the above-mentioned step 730 includes the following operation: pre-bonding the plurality of first pins and the plurality of second pins. The plurality of second pins generate an expansion value during the pre-bonding procedure.

For example, referring to FIG. 6A, FIG. 6C, and FIG. 6E, the plurality of first pins and the plurality of second pins generate an expansion value α1 as shown in FIG. 6A, an expansion value α2 as shown in FIG. 6C, or an expansion value α3 as shown in FIG. 6E during the pre-bonding procedure, respectively.

In some embodiments, the above-mentioned step 730 further includes the following operation: adjusting the plurality of first pins and the plurality of second pins to form the at least one central bonding pin and the at least two first bonding pins according to the expansion value.

For example, referring to FIG. 6A to FIG. 6F, by using Y direction adjustment translation skills, the bonding pins are adjusted with a displacement β1 shown in FIG. 6B through Y direction according to an expansion value α1 shown in FIG. 6A. The bonding pins are adjusted with a displacement 132 shown in FIG. 6D through Y direction according to an expansion value α2 shown in FIG. 6C. The bonding pins are adjusted with a displacement β3 shown in FIG. 6F through Y direction according to an expansion value α3 shown in FIG. 6E.

In some embodiments, the expansion value α1 is 0.5‰ (per mille), and the displacement β1 is 17 μm. In some embodiments, the expansion value α2 is 1‰, and the displacement β2 is 35 μm. In some embodiments, the expansion value α3 is 2‰, and the displacement β3 is 70 μm. The above-mentioned embodiments are the practice of the Y direction adjustment translation skills.

In some embodiments, the above-mentioned step 730 includes the following operation: bonding the plurality of first pins and bonding the plurality of second pins to each other to form the at least one central bonding pin in the central location of the bonding area of the electronic device, form the at least two first bonding pins located farthest away from the at least one central bonding pin and having mirror symmetry with respect to the at least one central bonding pin, and form the at least two second bonding pins located between the at least one central bonding pin and the at least two first bonding pins, wherein the at least two second bonding pins have mirror symmetry with respect to the at least one central bonding pin. One of the at least two second bonding pins includes a third end and a fourth end. A third width of the third end is set to be C, a fourth width of the fourth end is set to be D, and C and D satisfy a relation 0<C/D≤1.

For example, referring to FIG. 2 to FIG. 7, the plurality of first pins 110 and the plurality of second pins 210 are bonded to each other to form the at least one central bonding pin 410 in the central location of the bonding area of the electronic device 100, form the at least two first bonding pins 450 located farthest away from the at least one central bonding pin 410 and having mirror symmetry with respect to the at least one central bonding pin 410, and form the at least two second bonding pins 420 located between the at least one central bonding pin 410 and the at least two first bonding pins 450, wherein the at least two second bonding pins 420 have mirror symmetry with respect to the at least one central bonding pin 410. One of the at least one second bonding pins 420 includes a third end (e.g., the top end shown in FIG. 5) and a fourth end (e.g., the bottom end shown in FIG. 5). A third width of the third end is set to be C, a fourth width of the fourth end is set to be D, and C and D satisfy a relation 0<C/D≤1.

In some embodiments, referring to FIG. 4 and FIG. 5, when the width Z of the bonding area and the length L of the bonding area are unchanged, a relation between the design length L1 of the bonding area and the above-mentioned tilt angle θ is changed as listed below according to relations between internal spacings of the bonding pins and widths of the bonding pins of the above-mentioned embodiments:

TABLE 1

| Tilt angle θ | Width of bonding pins (μm) | Actual overlapped area (μm²) | Degree of improvement of the overlapped area (compared with the angle 90°) |
|---|---|---|---|
| 90° | 52.000 | 55329 | 0% |
| 85° | 51.000 | 67955 | 23% |
| 80° | 49.627 | 71279 | 29% |
| 75° | 47.868 | 71602 | 29% |
| 70° | 45.745 | 71027 | 28% |

TABLE 1-continued

| Tilt angle θ | Width of bonding pins (μm) | Actual overlapped area (μm²) | Degree of improvement of the overlapped area (compared with the angle 90°) |
|---|---|---|---|
| 65° | 43.274 | 70004 | 27% |
| 60° | 40.474 | 68827 | 27% |

According to table 1, the best of the tilt angles of the bonding pins is 80°, and the degree of improvement of the overlapped area is 29%.

Figure 8:
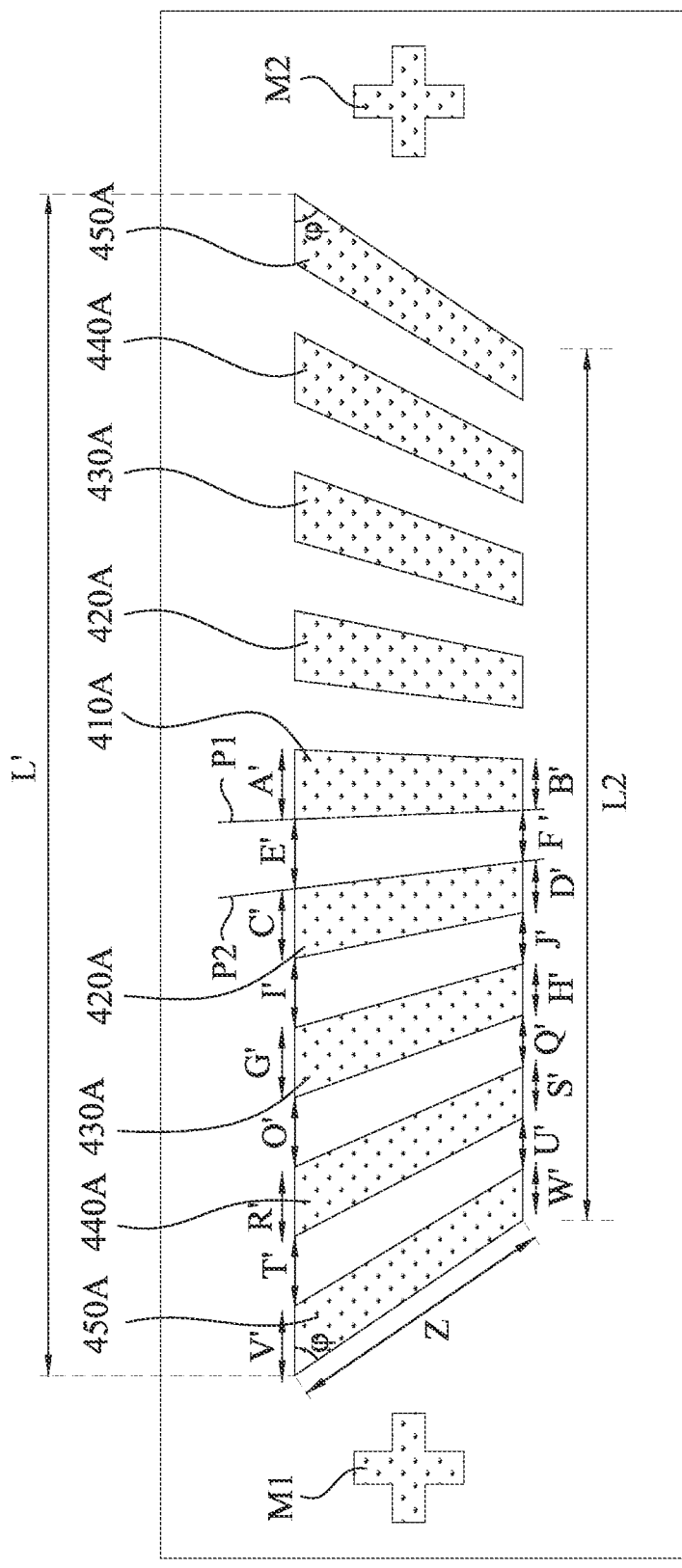
FIG. 8 depicts a bonding pin diagram according to some embodiments of the present disclosure.

FIG. 8 depicts a bonding pin diagram according to some embodiments of the present disclosure. FIG. 8 depicts the bonding pins of a modified embodiment of the embodiment shown in FIG. 5. In some embodiments, the embodiment shown in FIG. 5 has trapezoidal bonding pins designed with a smaller topline and a bigger baseline, and the embodiment shown in FIG. 8 has trapezoidal bonding pins designed with a bigger topline and a smaller baseline. The plurality of bonding pins shown in FIG. 8 includes a length L' of the bonding area and a designed length L2 of the bonding area.

In addition, the plurality of bonding pins include at least one central bonding pin 410A and at least two first bonding pins 450A. The at least one central bonding pin 410A is located in a central location of the bonding pins. The at least two first bonding pins 450A are located farthest away from the at least one central bonding pins 410A and have mirror symmetry with respect to the at least one central bonding pin 410A. The first bonding pins 450A are the closet to a first side M1 and a second side M2, and a tilt angle φ is formed between the first bonding pins 450A and one side of the substrate 120 (e.g., the top side shown in FIG. 8). When the bonding pins become closer to a central location, the tilt angle φ becomes closer to 90°.

In addition, a first width of the first end is set to be A'. A second width of the second end is set to be B'. A' and B' satisfy a relation A'/B'≥1. A tilt angle φ is formed between one of the at least two first bonding pins 450A and one side of the substrate 120 (e.g., the top side shown in FIG. 8), and φ satisfies a relation 0<φ≤90.

In some embodiments, the plurality of bonding pins further include at least two second bonding pins 420A. The at least two second bonding pins 420A are located between the at least one central bonding pin 410A and the at least two first bonding pins 450A, and the at least two second bonding pins 420A have mirror symmetry with respect to the at least one central bonding pin 410A. The at least two second bonding pins 420A include a third end and a fourth end. A third width of the third end is set to be C'. A fourth width of the fourth end is set to be D'. C' and D' satisfy a relation C'/D'≥1.

In some embodiments, based on the above-mentioned embodiments, each of the bonding pins (e.g., the bonding pins from the central location to the first side M1 are the central bonding pin 410A, the second bonding pins 420A, third bonding pins 430A, fourth bonding pins 440A, and the first bonding pins 450A shown in FIG. 8) includes a topline (e.g., the top ends shown in FIG. 8) width and a baseline (e.g., the bottom ends shown in FIG. 8) width. Every two of the bonding pins include an upper spacing and a lower spacing respectively.

In addition, topline widths of the bonding pins and upper spacings of every two of the bonding pins from the central bonding pin 410A to the first side M1 are the first width A' of the first end, a first spacing E', the third width C' of the third end, a third spacing I', a fifth width G' of the fifth end, an upper spacing O', a top width R', an upper spacing T', and a top width V' respectively. The above-mentioned topline widths and the upper spacings of the bonding pins are all the same.

Furthermore, baselines widths of the bonding pins and lower spacings of every two of the bonding pins from the central bonding pin 410A to the first side M1 are the second width B' of the second end, a second spacing F', the fourth width D' of the fourth end, a fourth spacing J', a sixth width H' of a sixth end, a lower spacing Q', a bottom width S', a lower spacing U', and a bottom width W' respectively. The above-mentioned baseline widths and the lower spacings of the bonding pins are all the same.

In some embodiments, the above-mentioned length L' of the bonding area and the above-mentioned length L of the bonding area can be the same or different. In some embodiments, the above-mentioned designed length L1 of the bonding area and the above-mentioned length L2 of the bonding area can be the same or different.

Based on the above embodiments, the present disclosure provides a bonding pad structure for an electronic device and a method for manufacturing a bonding pad structure for an electronic device to improve (i.e., reduce) problems in which bonding pads of display panels cannot be aligned to each other due to thermal expansion of materials of bonding pads.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A bonding pad structure for an electronic device, comprising:
   a substrate, comprising:
      a plurality of first pins, disposed on the substrate; and
   a flexible printed circuit board, comprising:
      a plurality of second pins, disposed on the flexible printed circuit board;
   wherein the first pins and the second pins are bonded to each other to define a plurality of bonding pins, and the bonding pins comprise:
      at least one central bonding pin, located in a central location of the bonding pins of the electronic device;
      at least two first bonding pins, located farthest away from the at least one central bonding pin, wherein the at least two first bonding pins have mirror symmetry with respect to the at least one central bonding pin; and
      at least two second bonding pins, located between the at least one central bonding pin and the at least two first bonding pins, wherein the at least two second bonding pins have mirror symmetry with respect to the at least one central bonding pin;
   wherein the at least one central bonding pin comprises:
      a first end and a second end, wherein a first width of the first end is set to be A, a second width of the second end is set to be B, and A and B satisfy a first relation 0<a/b≤1;

wherein a tilt angle is defined between one of the at least two first bonding pins and one side of the substrate, the tilt angle is set to be θ, and θ satisfies a second relation 0<θ≤90;

wherein a first end of a first pin of the first pins and a first end of a corresponding first pin of the second pins are equal in width;

wherein one of the at least two second bonding pins comprises:
  a third end and a fourth end, wherein a third width of the third end is set to be C, a fourth width of the fourth end is set to be D, and C and D satisfy a third relation 0<C/D≤1;

wherein the first width of the first end of the at least one central bonding pin is the same as the third width of the third end of the one of the at least two second bonding pins;

wherein the second width of the second end of the at least one central bonding pin is the same as the fourth width of the fourth end of the one of the at least two second bonding pins;

wherein a first spacing is defined between the first end of the at least one central bonding pin and the third end of the one of the at least two second bonding pins, wherein the first spacing, the first width of the first end, and the third width of the third end are all the same;

wherein a second spacing is defined between the second end of the at least one central bonding pin and the fourth end of the one of the at least two second bonding pins, the second spacing, the second width of the second end, and the fourth width of the fourth end are all the same, and the first spacing is smaller than the second spacing.

2. The bonding pad structure of claim 1, wherein the bonding pins are located in a bonding area of the electronic device, wherein a fourth relation between the second spacing, the second width of the second end, the fourth width of the fourth end, and a length of the bonding area is listed below:

$$B=D=F=L/(X+Y)$$

wherein B is the second width of the second end, D is the fourth width of the fourth end, F is the second spacing, L is the length of the bonding area, X is a number of the plurality of bonding pins, and Y is a number of internal spacings defined between every two of the plurality of bonding pins.

3. The bonding pad structure of claim 1, wherein the at least one central bonding pin is trapezoidal, wherein the at least two first bonding pins are trapezoidal.

4. The bonding pad structure of claim 1, wherein the at least one central bonding pin, the at least two first bonding pins, and the at least two second bonding pins are arranged on a same straight line.

5. The bonding pad structure of claim 1, wherein the bonding pins further comprise:
  at least two third bonding pins, located between the at least two first bonding pins and the at least two second bonding pins, wherein the at least two third bonding pins have mirror symmetry with respect to the at least one central bonding pin;
  wherein one of the at least two third bonding pins comprises:
    a fifth end and a sixth end, wherein a fifth width of the fifth end is set to be G, a sixth width of the sixth end is set to be H, and G and H satisfy a fifth relation 0<G/H≤1.

6. The bonding pad structure of claim 5, wherein a third spacing is defined between the third end of the one of the at least two second bonding pins and the fifth end of the one of the at least two third bonding pins, wherein a fourth spacing is defined between the fourth end of the one of the at least two second bonding pins and the sixth end of the one of the at least two third bonding pins, wherein the third spacing is smaller than the fourth spacing.

7. The bonding pad structure of claim 6, wherein the first spacing, the third spacing, the first width, the third width, and the fifth width are all the same, and the fourth spacing, the second width, the fourth width, and sixth width are all the same.

8. The bonding pad structure of claim 5, wherein the at least one central bonding pin, the at least two first bonding pins, the at least two second bonding pins, and the at least two third bonding pins are arranged on a same straight line.

9. The bonding pad structure of claim 1, wherein one of the first pins or the second pins has an expansion value during a pre-bonding procedure.

10. A method for manufacturing a bonding pad structure for an electronic device, comprising:
  disposing a plurality of first pins on a substrate;
  disposing a plurality of second pins on a flexible printed circuit board wherein a first end of a first pin of the first pins and a first end of a corresponding first pin of the second pins are equal in width; and
  bonding the first pins and the second pins to each other to form at least one central bonding pin in a central location of a bonding area of the electronic device, form at least two first bonding pins located farthest away from the at least one central bonding pin and form at least two second bonding pins located between the at least one central bonding pin and the at least two first bonding pins, wherein the at least two first bonding pins have mirror symmetry with respect to the at least one central bonding pin, wherein the at least two second bonding pins have mirror symmetry with respect to the at least one central bonding pin, wherein the at least one central bonding pin comprises a first end and a second end, wherein a first width of the first end is set to be A, a second width of second end is set to be B, and A and B satisfy a first relation 0<A/B≤1, wherein a tilt angle is formed between one of the at least two first bonding pins and one side of the substrate, the tilt angle is set to be θ, and θ satisfies a second relation 0<θ≤90, wherein one of the at least two second bonding pins comprises a third end and a fourth end, wherein a third width of the third end is set to be C, a fourth width of the fourth end is set to be D, and C and D satisfy a third relation 0<C/D≤1, wherein the first width of the first end of the at least one central bonding pin is the same as the third width of the third end of the one of the at least two second bonding pins, wherein the second width of the second end of the at least one central bonding pin is the same as the fourth width of the fourth end of the one of the at least two second bonding pins, wherein a first spacing is defined between the first end of the at least one central bonding pin and the third end of the one of the at least two second bonding pins, wherein the first spacing, the first width of the first end, and the third width of the third end are all the same, wherein a second spacing is defined between the second end of the at least one central bonding pin and the fourth end of the one of the at least two second bonding pins, the second spacing, the second width of the second end, and the fourth width of the fourth end are all the same, and the first spacing is smaller than the second spacing;

wherein bonding the first pins and the second pins comprises:
   pre-bonding the first pins and the second pins, wherein the second pins generate an expansion value during a pre-bonding procedure; and
   controlling a position of the second pins relative to the first pins according to the expansion value.

\* \* \* \* \*